(12) United States Patent
Beals et al.

(10) Patent No.: US 9,760,742 B2
(45) Date of Patent: Sep. 12, 2017

(54) DUAL PURPOSE PRESS-BAR AND HEAT SINK FOR HIGH DATA TRANSFER INTEGRATED CIRCUIT CARD READER

(71) Applicant: EchoStar Technologies L.L.C., Englewood, CO (US)

(72) Inventors: William Michael Beals, Englewood, CO (US); Jerome A. LaPalme, Aurora, CO (US)

(73) Assignee: EchoStar Technologies L.L.C., Englewood, CO (US)

( * ) Notice: Subject to any disclaimer, the term of this patent is extended or adjusted under 35 U.S.C. 154(b) by 0 days.

(21) Appl. No.: 14/752,626

(22) Filed: Jun. 26, 2015

(65) Prior Publication Data
US 2016/0379016 A1    Dec. 29, 2016

(51) Int. Cl.
*G06K 19/00* (2006.01)
*G06K 7/00* (2006.01)
*H05K 1/02* (2006.01)

(52) U.S. Cl.
CPC ......... *G06K 7/0056* (2013.01); *G06K 7/0021* (2013.01); *H05K 1/0209* (2013.01); *H05K 2201/066* (2013.01)

(58) Field of Classification Search
USPC .................................................. 235/487, 492
See application file for complete search history.

(56) References Cited

U.S. PATENT DOCUMENTS

| 6,721,182 | B1* | 4/2004 | Wells ................... H05K 7/1404 257/727 |
| 8,167,643 | B2 | 5/2012 | Yoshida et al. |
| 8,172,619 | B2 | 5/2012 | Williams |
| 8,747,163 | B2 | 6/2014 | Little et al. |
| 9,076,050 | B2 | 7/2015 | LaPalme et al. |
| 2002/0050516 | A1 | 5/2002 | Kitchen |
| 2011/0069456 | A1 | 3/2011 | Brandon et al. |
| 2011/0130029 | A1 | 6/2011 | Yoshida et al. |
| 2011/0300759 | A1 | 12/2011 | Ngo |
| 2012/0243176 | A1* | 9/2012 | Ritter ................. H05K 7/20445 361/692 |
| 2013/0347051 | A1* | 12/2013 | Bose .................... H04N 21/418 725/151 |
| 2014/0162490 | A1* | 6/2014 | Hodge ..................... G06K 7/00 439/487 |
| 2014/0198456 | A1* | 7/2014 | Bose .................... H05K 7/2049 361/720 |

FOREIGN PATENT DOCUMENTS

DE    20 2007 006 626 U1    10/2007
WO    2012/118545 A1    9/2012

OTHER PUBLICATIONS

International Search Report from PCT/US2016/018637, mailing date May 9, 2016, 4 pages.

* cited by examiner

*Primary Examiner* — Matthew Mikels
(74) *Attorney, Agent, or Firm* — Seed IP Law Group LLP

(57) ABSTRACT

Various embodiments provide a dual purpose press-bar and heat sink for an integrated circuit card (ICC) reader. The dual purpose press-bar and heat sink provides two functions. First, the dual purpose press-bar and heat sink conducts and dissipates internal heat generated by a high data transfer ICC inserted in to the ICC reader. Second, the dual purpose press-bar and heat sink ensures that contact pads of the high data transfer ICC create reliable electrical connections with ICC contacts of the ICC reader. As such, the dual purpose press-bar and heat sink simultaneously dissipates heat from a high data transfer ICC and ensures that a high data transfer ICC maintains proper electrical connections with ICC contacts of an ICC reader.

17 Claims, 7 Drawing Sheets

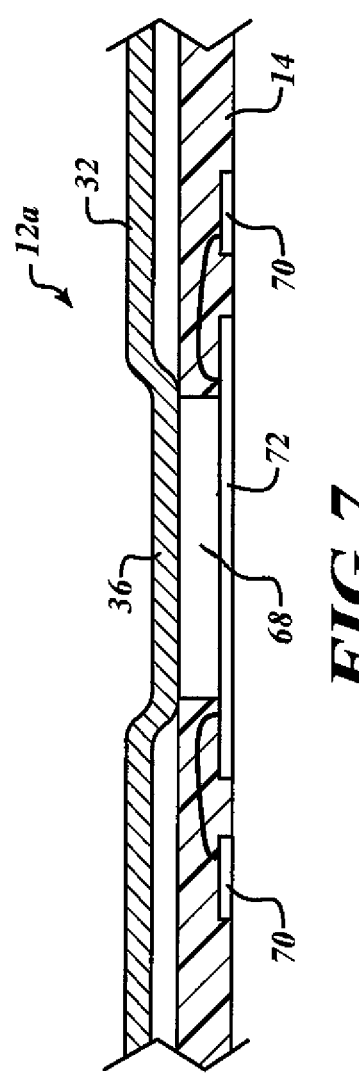

DUAL PURPOSE PRESS-BAR AND HEAT SINK FOR HIGH DATA TRANSFER INTEGRATED CIRCUIT CARD READER

BACKGROUND

Technical Field

The present disclosure generally relates to a heat sink for a card reader. In particular, the present disclosure is directed to a dual purpose press-bar and heat sink for high data transfer card reader.

Description of the Related Art

As more integrated circuit cards (ICC), such as smart cards and subscriber identification module (SIM) cards, are deployed into the population, ICC readers have generally become ubiquitous in a variety of electronic devices, portable or not. In general, an ICC houses an embedded circuit capable of providing identification and authentication. Certain signals of the embedded circuit are brought to the surface of the ICC through a number of contact pads. When inserted into an ICC reader, these contact pads provide electrical connectivity between the embedded circuit within the ICC and a host in which the ICC reader resides. To effect the electrical connection between the ICC and the host, a connector is employed in the ICC reader to serve as the interface. The ICC reader requires a physical connection to the ICC that is made by inserting the ICC into the ICC reader. Two known technologies of insertion are (1) "sliding" contact technology and (2) "landing" contact technology. In general, sliding contact technology requires a "swipe" of the ICC to register the data on the ICC, providing convenience, while landing contact technology requires the ICC to be inserted inside the reader before data can be registered.

Conventional ICCs conform to ISO/IEC standards. While ISO 7810 standardizes the outer dimension of an ICC, or the card "envelope," ISO 7816 standardizes the location and signal connectivity of the card's contact pads. ISO 7810 and ISO 7816 are standards well known in the art and will not be discussed in detail in this description.

ICCs and ICC readers with increased functionality are being designed. Consequently, these ICCs may use more power and, thus, ways to dissipate heat from the ICCs may be needed.

BRIEF SUMMARY

In accordance with the present disclosure, a dual purpose press-bar and heat sink for an integrated circuit card (ICC) reader is provided. The dual purpose press-bar and heat sink provides two functions. First, the dual purpose press-bar and heat sink conducts and dissipates internal heat generated by a high data transfer ICC inserted in to the ICC reader. Second, the dual purpose press-bar and heat sink ensures that contact pads of the high data transfer ICC create reliable electrical connections with ICC contacts of the ICC reader. As such, the dual purpose press-bar and heat sink simultaneously dissipates heat from a high data transfer ICC and ensures that a high data transfer ICC maintains proper electrical connections with ICC contacts of an ICC reader.

According to a first embodiment, an ICC reader includes a support member mounted to a circuit board and an encasing member. The support member is configured to support a high data transfer ICC when inserted in to the ICC reader and secure ICC contacts to the circuit board. The encasing member is physically coupled to the support member and includes a dual purpose press-bar and heat sink. The dual purpose press-bar and heat sink has four sides and extends from the encasing member towards the support member. Particularly, the dual purpose press-bar and heat sink is physically coupled to the encasing member on each of its four sides and protrudes from the encasing member towards the support member. In a preferred embodiment, the dual purpose press-bar and heat sink is positioned to overlie the ICC contacts and make physical contact with the high data transfer ICC at a position corresponding to an embedded circuit housed within the high data transfer ICC.

According to a second embodiment, an ICC reader includes a support member mounted to a circuit board and an encasing member. The support member is configured to support a high data transfer ICC when inserted in to the ICC reader and secure ICC contacts to the circuit board. The encasing member is mounted to the circuit board and overlies the support member. The encasing member includes a dual purpose press-bar and heat sink that is "L" shaped and extends from the encasing member towards the support member. Particularly, the dual purpose press-bar and heat sink is physically coupled to the encasing member on one side and is curved towards the support member, creating an opening in the encasing member. In a preferred embodiment, the dual purpose press-bar and heat sink is positioned to overlie the ICC contacts and make physical contact with the high data transfer ICC at a position corresponding to an embedded circuit housed within the high data transfer ICC.

BRIEF DESCRIPTION OF THE SEVERAL VIEWS OF THE DRAWINGS

The foregoing and other features and advantages of the present disclosure will be more readily appreciated as the same become better understood from the following detailed description when taken in conjunction with the accompanying drawings.

FIG. 7 illustrates a simplified cross-sectional view, of a dual purpose press-bar and heat sink and a high data transfer ICC according to one embodiment.

DETAILED DESCRIPTION

Figure 1:
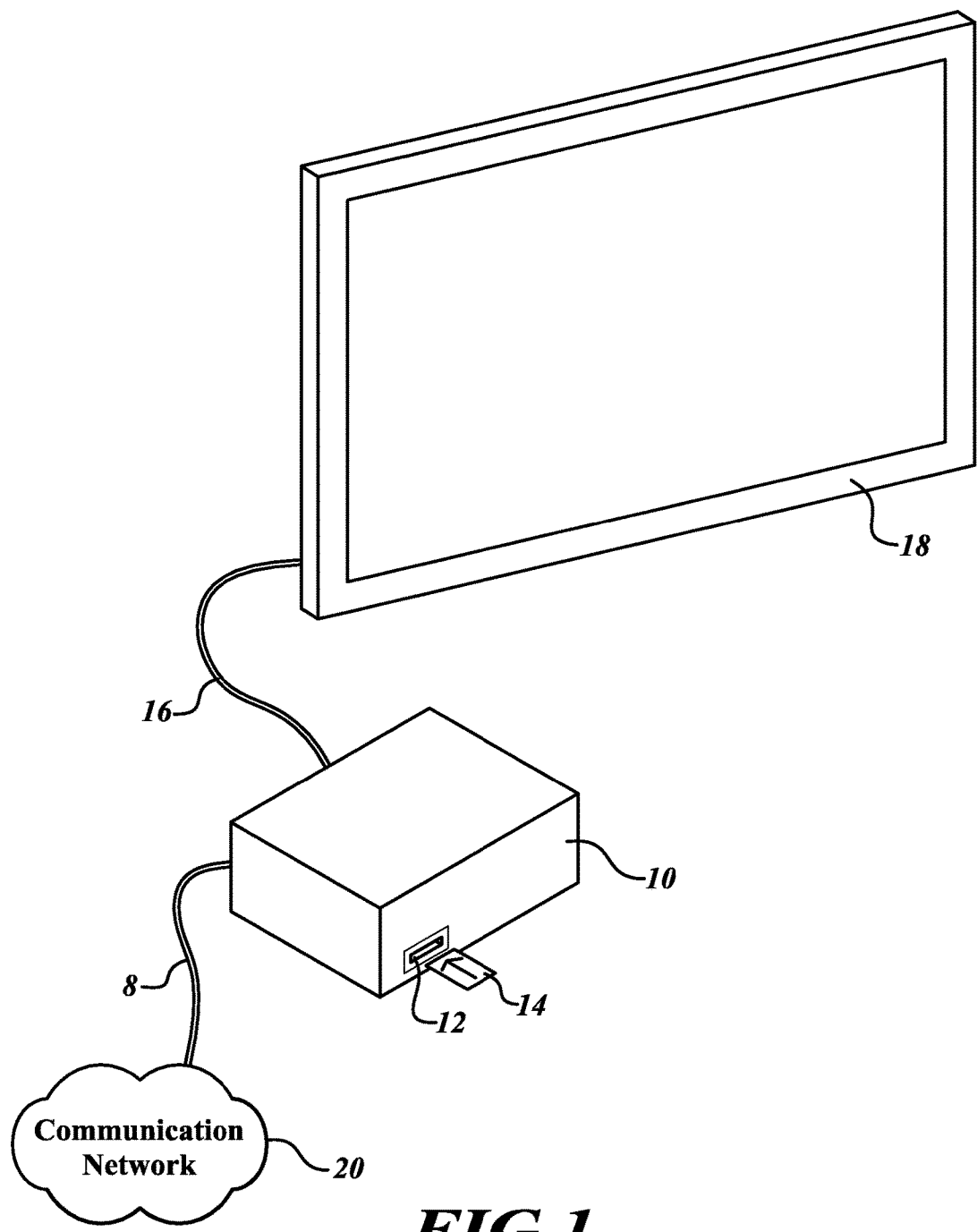
FIG. 1 illustrates an exemplary entertainment system that includes a client device in which an embodiment of an ICC reader is implemented.

In the following description, certain specific details are set forth in order to provide a thorough understanding of various embodiments of the disclosure. However, one skilled in the art will understand that the disclosure may be practiced without these specific details. In some instances, well-known structures associated with the manufacturing of semiconductor wafers have not been described in detail to avoid obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In the drawings, identical reference numbers identify similar features or elements. The size and relative positions of features in the drawings are not necessarily drawn to scale.

Referring to FIG. 1, an integrated circuit card (ICC) 14 typically has a contact area (not shown) comprising several gold-plated contact pads. These contact pads provide electrical connectivity when inserted into an ICC reader 12, which is used as a communication medium between the ICC 14 and a host 10. The host 10 provides power to the ICC 14 through the ICC reader 12. On a conventional ICC 14, the contact area is defined by the ISO/IEC standards. For example, for a smart card, ISO 7816 defines a one square centimeter contact area comprising eight contact pads, six of them are defined: VCC, GND, Reset, Clock, Vpp, Serial Data I/O, while two are Reserved for Future Use, RFU1 and RFU2.

It is contemplated that a high data transfer ICC 14 with additional data intensive functions, such as data encryption and decryption, will soon be used in set-top boxes and as part of an improved conditional access security system. A high data transfer smart card will require more than the conventional eight contact pads. Particularly, a high data transfer smart card may have twelve defined contact pads (e.g., CLK, RST, VCC, SC IN−, SC IN+, I/O, VPP, VSS, CLK−, CLK+, SC OUT−, SC OUT+) on one surface of the smart card, with eight of the contact pads being in the same location as the eight contact pads in the conventional smart card set forth by the ISO 7816 standard, two contact pads being added to each of the four-contact-pad rows, and two new contact pads being added in a row between the four-contact-pad rows. The ISO RFU1 and ISO RFU2 contact pads that are part of a conventional smart card may be omitted if not used. For example, see U.S. patent application Ser. No. 13/797,594, filed Mar. 12, 2013 and entitled "Enhanced smart card reader with multi-level reading contacts." With the additional functions and contact pads, high data transfer ICCs 14 may generate significant internal heat. One particular issue is that a processor on board a high data transfer ICC 14 may generate a large amount of heat that should be dissipated by more than just the contact pads.

A dual purpose press-bar and heat sink for an ICC reader 12 is provided. In a preferred embodiment, the high data transfer ICC reader 12 is configured to read both high data transfer ICCs 14 and conventional ICCs.

FIG. 1 illustrates an entertainment system of a subscriber to a broadcast service with a conditional access system, according to one embodiment. The entertainment system of FIG. 1 includes a client device 10 coupled to a display device 18 over a first cable 16 and to a communication network 20 over a second cable 8. The client device 10 includes an ICC reader 12 configured to receive and read a high data transfer ICC 14.

The client device 10 receives program content transmitted from at least a content service provider (not shown) over the communication network 20. The program content may be in the form of video, audio, data, multimedia, or another form appropriate for transmission over the communication network 20. The communication network 20 facilitates the transmission of content from the content service provider to the client device 10. The communication network 20 may include any type of wired or wireless communication system, such as satellite, antenna, cable, and servers, in their associated network topologies. In a preferred embodiment, the content service provider is a direct broadcast satellite service provider transmitting content over a satellite communication network that includes antennas and satellites, and the client device 10 is a set top box.

The client device 10 is configured to receive program content from the communication network 20 and output the program content for display on the display device 18. Because some program content is made available only to subscribers who pay a premium, some program content may be protected to be accessible only to those subscribers. Such program content protection may be implemented by encrypting or scrambling the program content before it is transmitted to the client device 10. The client device 10, therefore, requires a decrypting or descrambling key or data to output the protected contents to the display device 18. In many instances, the content service provider provides the premium paying subscriber with the high data transfer ICC 14 containing the appropriate key or data. With the high data transfer ICC 14 inserted in the ICC reader 12, the client device 10 can access and use the encryption key in the high data transfer ICC 14 to decrypt or descramble the protected program content. In a preferred embodiment, DVB-CSA and DVB-CI standards for content protection and conditional access is used. Other conditional access systems are also contemplated.

Figure 2:
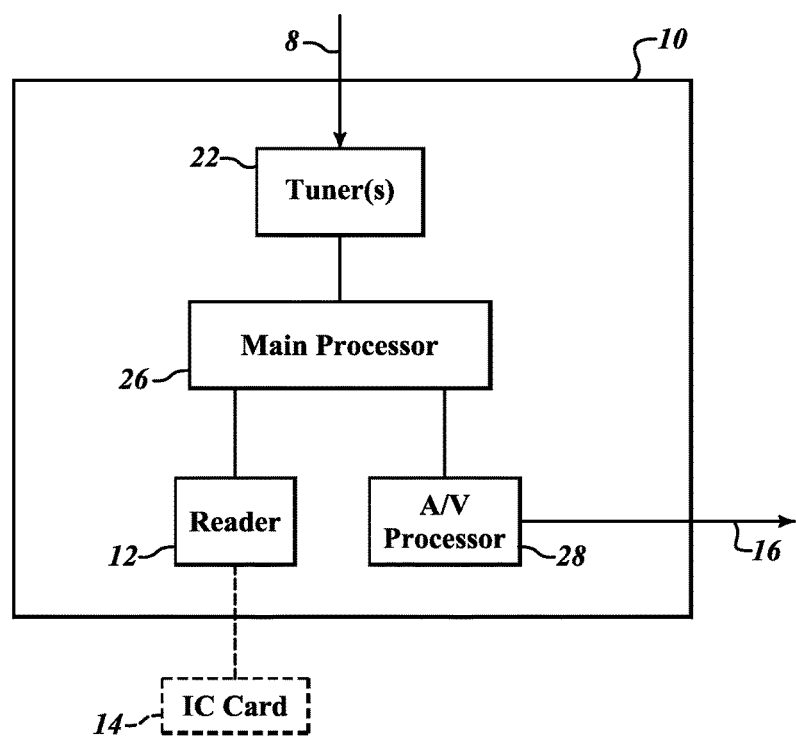
FIG. 2 is a block diagram of an exemplary client device in which one embodiment of an ICC reader is implemented.

FIG. 2 shows a block diagram of the client device 10. The client device 10 includes tuner(s) 22, a main processor 26, an audio/video processor 28, and the ICC reader 12. In one embodiment, the audio/video processor 28 is on the same integrated chip as the main processor 26. The client device 10 may include more functionalities and components than those illustrated in FIG. 2. In addition, each module may be implemented in hardware, software, firmware or a combination thereof.

The tuner(s) 22 is configured to receive an encrypted audio/video data stream. Particularly, as discussed with respect to FIG. 1, the tuner(s) receive program content from a content service provider through the communication network 20 and the cable 8.

The main processor 26 oversees data exchange between the client device 10 and the high data transfer ICC 14. Particularly, the main processor 26 is configured to extract encrypted audio/video program content from the received audio/video data stream based on an input from a user, and then forward the selected encrypted audio/video program content to the ICC reader 12.

The audio/video processor 28 provides descrambled audio/video content to the display device 18 through cable 16.

The ICC reader 12 is configured to provide the selected encrypted audio/video program content to the high data transfer ICC 14. The ICC reader 12 will be discussed in further detail with respect to FIGS. 3-6.

In prior systems, a client device also included a descrambler or decoder that is configured to decode an audio/video signal from a tuner. For the client device 10 of the inventive system, the descrambler or decoder resides on the high data transfer ICC 14 itself. As such, rather than supply an encryption key or password to the main processor 26, the encryption key stays on the high data transfer ICC 14, and the high data transfer ICC 14 decrypts or descrambles selected encrypted audio/video program content. For example, in one embodiment, the descramble module on the high data transfer ICC 14 is a high data rate processor with full decode capability that can operate in real time. The high data transfer ICC 14 descrambles selected encrypted audio/video program content and re-scrambles it with a local key. The high data transfer ICC 14 then provides the re-scrambled audio/video program content to the ICC reader 12 and the main processor 26. The main processor 26 then descrambles the re-scrambled audio/video content with the local key and routes it to the audio/video processor 28, which provides the descrambled audio/video content to the display device 18.

Prior ICCs generated little to no excess heat because audio/video program content was processed on a client device instead of the ICC. In contrast, for the client device 10, according to the inventive system, one of the main processing tasks of a conventional client device is now carried out on the high data transfer ICC 14. Consequently, the high data transfer ICC 14 operates at a high data rate, processes a large amount of data, and consumes a relatively large amount of power. This in turn causes the high data transfer ICC 14 to generate a significant amount of heat.

It is therefore beneficial to have a structure in an ICC reader that can remove heat from a high data transfer ICC and dissipate the heat to a larger, more open space. The ICC reader 12 as described herein provides a dual purpose press-bar and heat sink to remove excess heat from the high data transfer ICC 14.

Figure 3:
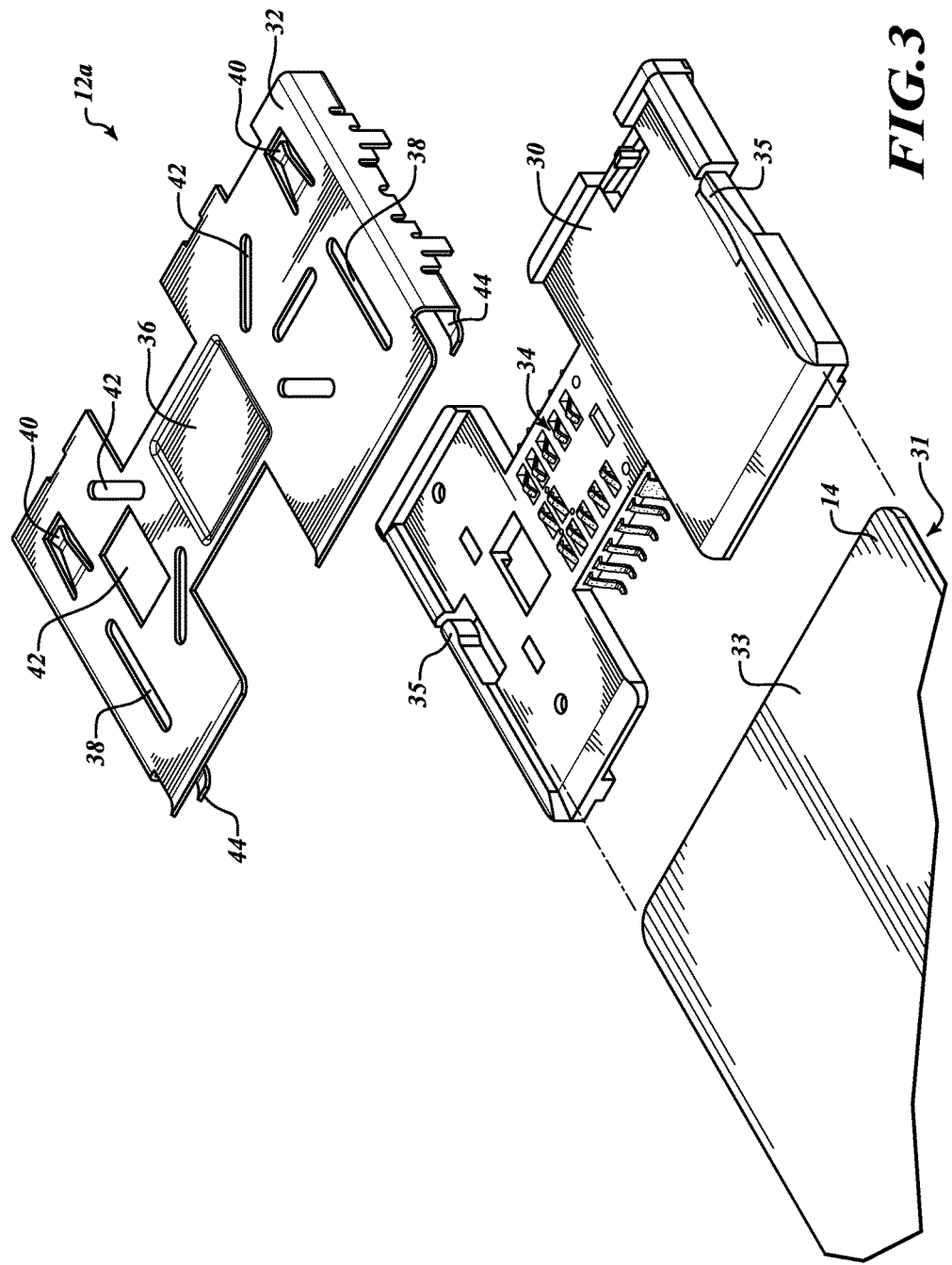
FIG. 3 illustrates a simplified exploded angled view of an ICC reader including a dual purpose press-bar and heat sink according to a first embodiment.

FIG. 3 illustrates a simplified exploded angled view of an ICC reader 12a according to a first embodiment, and a simplified angled view of a high data transfer ICC 14 according to the first embodiment. The high data transfer ICC 14 has a first side 31 that includes contact pads (not shown) electrically coupled to an embedded circuit housed within the high data transfer ICC 14, and a second side 33 opposite to the first side. It should be noted that, although the high data transfer ICC 14 is shown as a smart card, the ICC reader 12a may be adapted to be used for any type of ICC, including conventional ICCs. The ICC reader 12a includes a support member 30 and an encasing member 32.

The support member 30 includes guiding members 35 to guide an insertion of the high data transfer ICC 14. The support member 30 may be formed using techniques now known or later developed. In a preferred embodiment, the support member 30 is made of non-conductive materials commonly used for ICC readers. For example, plastic, such as ABS or high temperature LCP, may be used.

The support member 30 is configured to support the high data transfer ICC 14 when inserted into the ICC reader 12a and secure ICC contacts 34. Each of the ICC contacts 34 are configured to create electrical connections with the contact pads on the first side 31 of the high data transfer ICC 14. For example, for a high data transfer smart card, the ICC contacts may be configured to create electrical connections with the CLK, RST, VCC, SC IN−, SC IN+, I/O, VPP, VSS, CLK−, CLK+, SC OUT−, SC OUT+ contact pads. It should be noted that, although the ICC contacts 34 are formed in adjacent rows, the ICC reader 12a may include any number of ICC contacts and have any configuration. As will be discussed in further detail with respect to FIG. 4, the support member 30 and the ICC contacts 34 are mounted to a circuit board.

The encasing member 32 includes a dual purpose press-bar and heat sink 36, ribs 38, retention clips 40, an inspection hole 42, and engaging portions 44. In a preferred embodiment, the encasing member 32, including the dual purpose press-bar and heat sink 36, the ribs 38, and the retention clips 40, and the engaging portions 44, is made from a single piece of metal of high thermal conductibility, such as copper, aluminum, tungsten, silver, gold, titanium, platinum, steel, stainless steel, tantalum, or combinations thereof. A preferred material is a copper alloy. The encasing member 32 may be formed using techniques now known or later developed. For example, the encasing member 32 may be formed by stamping a flat sheet of metal using a forming press. Alternatively, the encasing member 32 may be cut by lasers or chemically etched.

The dual purpose press-bar and heat sink 36 has four sides and extends from the encasing member 32 towards the support member 30. Particularly, the dual purpose press-bar and heat sink 36 is physically coupled to the encasing member 32 on each of its four sides and protrudes from the encasing member 32 towards the support member 30.

Figure 4:
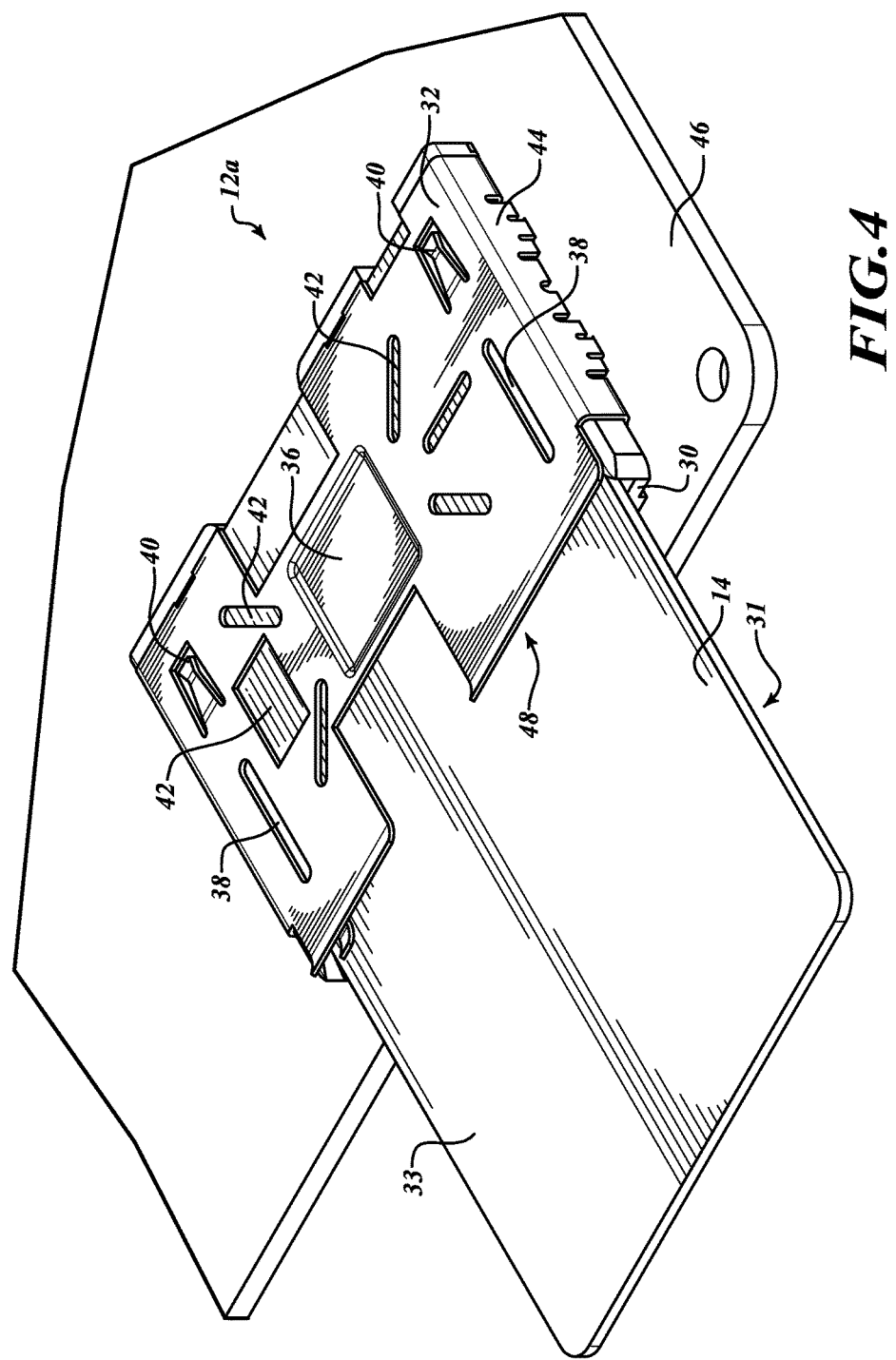
FIG. 4 illustrates a simplified angled view of the ICC reader of FIG. 3, with some modifications, assembled and mounted to a circuit board.

The dual purpose press-bar and heat sink 36 is configured to make physical contact with the second side 33 of the high data transfer ICC 14. In a preferred embodiment, the dual purpose press-bar and heat sink 36 is positioned to overlie the ICC contacts 34 and make physical contact with the second side 33 of the high data transfer ICC 14 at a position corresponding to the embedded circuit housed within the high data transfer ICC 14. For example, see the simplified angled view of the ICC reader 12a assembled with the high data transfer ICC 14 inserted as illustrated in FIG. 4.

The dual purpose press-bar and heat sink 36 conducts and dissipates internal heat generated by the embedded circuit housed within the high data transfer ICC 14. In a preferred embodiment, the surface area of the dual purpose press-bar and heat sink 36 is large to increase its contact with the high data transfer ICC 14 and a surrounding cooling medium, such as air. The dual purpose press-bar and heat sink 36 will be discussed in further detail with respect to FIG. 4.

The ribs 38 protrude from the encasing member 32 towards the support member 30. The ribs 38 are configured to make physical contact with the second side 33 of the high data transfer ICC 14. The ribs 38 ensure that the high data transfer ICC 14 remains coplanar when inserted in to the ICC reader 12a.

The retention clips 40 are configured to apply a physical force on the high data transfer ICC 14 when inserted in to the ICC reader 12a. The retention clips 40 ensure that the high data transfer ICC 14 remains stationary when inserted.

The inspection holes 42 provide visual access to the inside of the ICC reader 12a when assembled. For example, the inspection holes 42 provide visual access to and venting of heat for the ICC contacts 34 after the encasing member 32 is physically coupled to the support member 30.

The engaging portions 44 are configured to engage the support member 30 to physically couple the encasing member 32 to the support member 30. For example, see the simplified angled view of the ICC reader 12a assembled as illustrated in FIG. 4. The engaging portions 44 will be discussed in further detail with respect to FIG. 4.

FIG. 4 illustrates a simplified angled view of the ICC reader 12a according to the first embodiment, with some modifications, assembled and mounted to a circuit board 46 with the high data transfer ICC 14 inserted.

The circuit board 46 includes an integrated circuit (not shown) configured to provide, for example, identification, authentication, data storage, applications, data encryption, and data decryption. The circuit board 46 also includes electrical components (not shown), such as transistors, inductors, resistors, and capacitors, for the tuner(s) 22, the processor 26, and the audio/video processor 28.

The support member 30 is mounted to the circuit board 46. As discussed with respect to FIG. 3, the support member 30 is configured to support the high data transfer ICC 14 when inserted and secure the ICC contacts 34. The support member 30 secures the ICC contacts 34 to the circuit board 46 such that the ICC contacts 34 are electrically connected to contact pads on the circuit board 46 and are electrically connected to the contact pads on the first side 31 of the high data transfer ICC 14 when the high data transfer ICC 14 is inserted.

The encasing member 32 is physically coupled to the support member 30 by the engaging portions 44. Particularly, the engaging portions 44 are clipped on to the support member 30. When the encasing member 32 is physically coupled to the support member 30 and the high data transfer ICC 14 is inserted, the dual purpose press-bar and heat sink 36, the ribs 38, and the retention clips 40 physically contacts the second side 33 of the high data transfer ICC 14 leaving a space 48 between the encasing member 32 and the second side 33 of the high data transfer ICC 14. As such, the support member 30 and the encasing member 32 both support the high data transfer ICC 14 when assembled. It should be noted that, although the encasing member 32 is coupled to the support member 30 by the engaging portions 44, any method may be used to physically couple the encasing member 32 to the support member 30.

As discussed with respect to FIG. 3, the encasing member 32 and the dual purpose press-bar and heat sink 36 are both made of metal of high thermal conductibility, such as copper. By having both the encasing member 32 and the dual purpose press-bar and heat sink 36 made of metal and directly connected to each other, the encasing member 32, itself, can accept and remove heat in addition to the dual purpose press-bar and heat sink 36. Particularly, the encasing member 32, itself, spreads heat over a larger surface area and increases the contact area with a surrounding cooling medium, such as air. As such, the encasing member 32 assists the dual purpose press-bar and heat sink 36 for rapid transfer of heat from the high data transfer ICC 14. In addition, the space 48 allows a surround cooling medium to flow between the encasing member 32 and the second side 33 of the high data transfer ICC 14. As such, a surrounding cooling medium may contact both the top and bottom surfaces of the upper portion of the encasing member 32, thereby further improving heat dissipation.

The dual purpose press-bar and heat sink 36 provides two functions. First, the dual purpose press-bar and heat sink 36 conducts and dissipates internal heat generated by the high data transfer ICC 14. Particularly, as discussed with respect to FIG. 3, the dual purpose press-bar and heat sink 36 physically contacts the second side 33 of the high data transfer ICC 14 at a position corresponding to the embedded circuit housed within the high data transfer ICC 14, and dissipates heat generated by the embedded circuit. Second, the dual purpose press-bar and heat sink 36 ensures that the contact pads on the first side 31 of the high data transfer ICC 14 create reliable electrical connections with the ICC contacts 34. Particularly, in addition to the ribs 38 and the retention clips 40, the dual purpose press-bar and heat sink 36 ensures that the high data transfer ICC 14 remains coplanar when inserted in to the ICC reader 12a and ensures that the high data transfer ICC 14 remains stationary when inserted. Therefore, in contrast to conventional encasing members that are typically made of plastic and act as a thermal insulator, the encasing member 32 includes the dual purpose press-bar and heat sink 36 that simultaneously dissipates heat from the high data transfer ICC 14 and ensures that the high data transfer ICC 14 maintains proper electrical connections with the ICC contacts 34.

Figure 5:
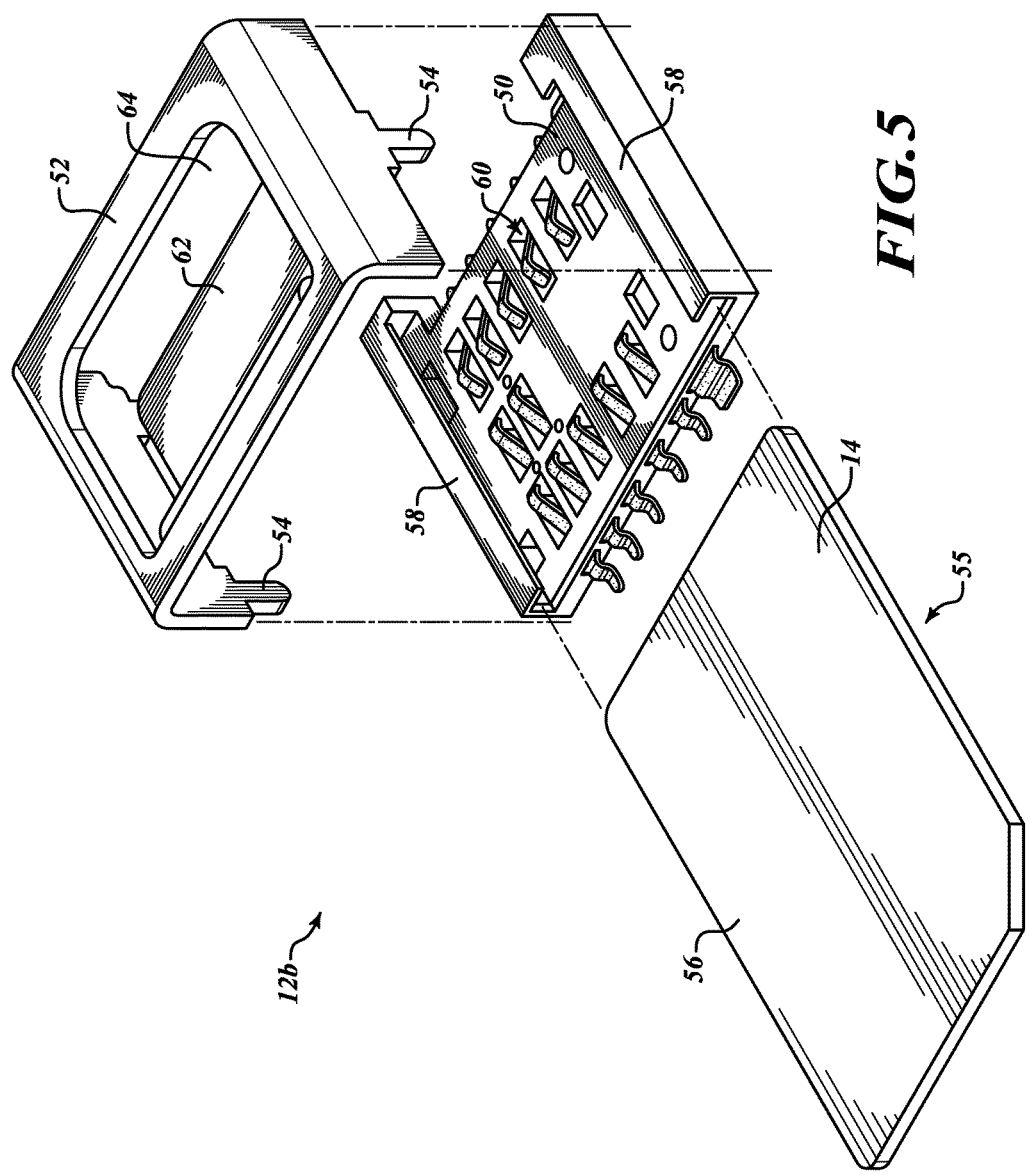
FIG. 5 illustrates a simplified exploded angled view of an ICC reader including a dual purpose press-bar and heat sink according to a second embodiment.

FIG. 5 illustrates a simplified exploded angled view of an ICC reader 12b according to a second embodiment, and a simplified angled view of a high data transfer ICC 14 according to the second embodiment. The high data transfer ICC 14 has a first side 55 that includes contact pads electrically coupled to an embedded circuit housed within the high data transfer ICC 14, and a second side 56 opposite to the first side. It should be noted that, although the high data transfer ICC 14 is shown as a type of SIM card, the ICC reader 12b may be adapted to be used for any type of ICC, including conventional ICCs. The ICC reader 12b includes a support member 50 and an encasing member 52.

The support member 50 includes guiding members 58 to guide an insertion of the high data transfer ICC 14. The support member 50 may be formed using techniques now known or later developed. In a preferred embodiment, the support member 50 is made of non-conductive materials commonly used for ICC readers. For example, plastic, such as ABS or high temperature LCP, may be used.

The support member 50 is configured to support the high data transfer ICC 14 when inserted in to the ICC reader and secure ICC contacts 60. Each of the ICC contacts 60 are configured to create electrical connections with the contact pads on the first side 55 of the high data transfer ICC 14. It should be noted that, although the ICC contacts 60 are formed in adjacent rows, the ICC reader 12b may include any number of ICC contacts and have any configuration. As will be discussed in further detail with respect to FIG. 6, the support member 50 and the ICC contacts 60 are mounted to a circuit board.

The encasing member 52 includes a dual purpose press-bar and heat sink 62 and mounting portions 54. In a preferred embodiment, the encasing member 52, including the dual purpose press-bar and heat sink 62 and the mounting portions 54, is made from a single piece of metal of high thermal conductibility, such as copper, aluminum, tungsten, silver, gold, titanium, platinum, steel, stainless steel, tantalum, or combinations thereof. A preferred material is a copper alloy. The encasing member 52 may be formed using techniques now known or later developed. For example, the encasing member 52 may be formed by stamping a flat sheet of metal using a forming press. Alternatively, the encasing member 52 may be cut by lasers or chemically etched.

Figure 6:
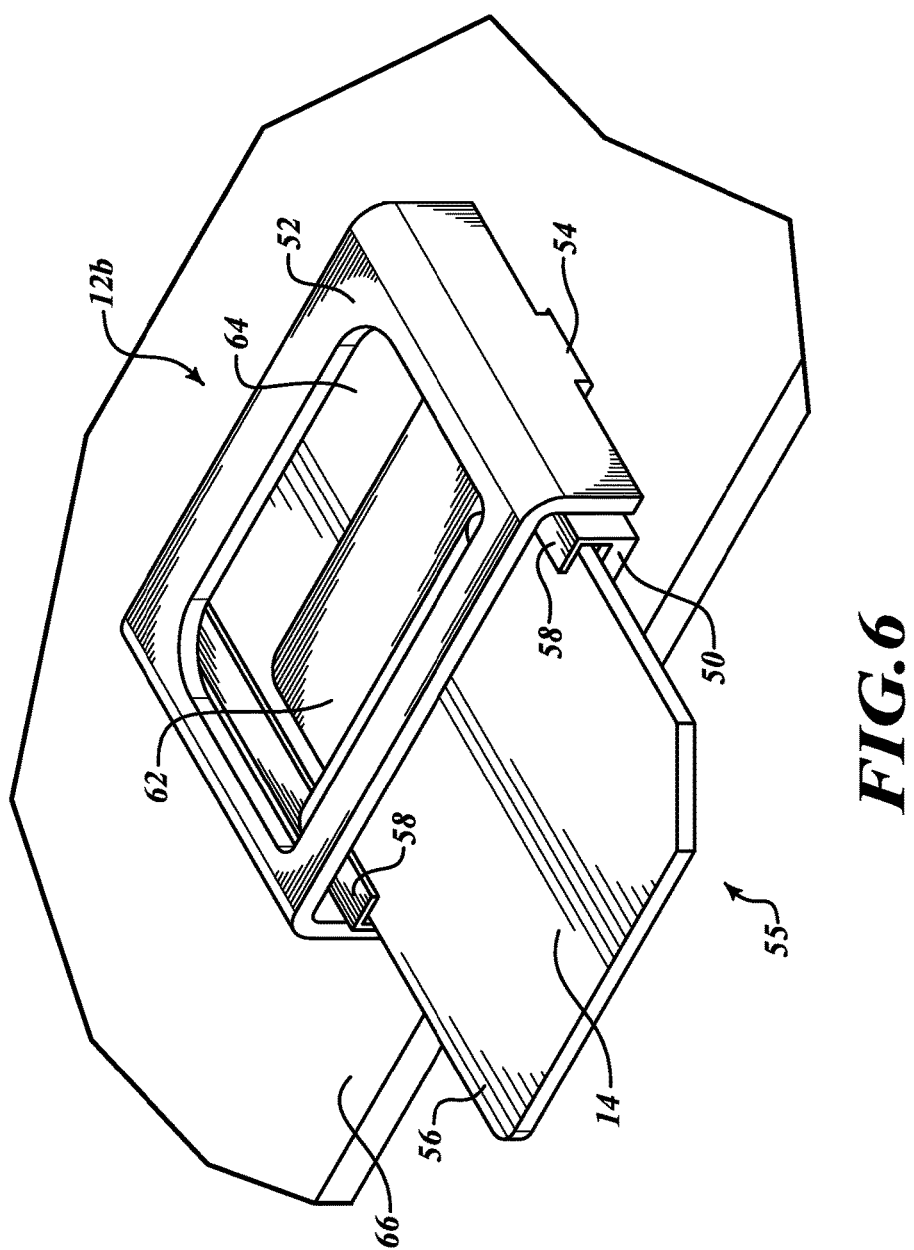
FIG. 6 illustrates a simplified angled view of the ICC reader of FIG. 5 assembled and mounted to a circuit board.

In contrast to the dual purpose press-bar and heat sink 36 of the ICC reader 12a, the dual purpose press-bar and heat sink 62 is "L" shaped and extends from the encasing member 52 towards the support member 50. Particularly, the dual purpose press-bar and heat sink 62 is physically coupled to the encasing member 52 on one side and is curved towards the support member 50, creating an opening or aperture 64 in an upper portion of the encasing member 52. For example, see the simplified angled view of the ICC reader 12b assembled with the high data transfer ICC 14 inserted as illustrated in FIG. 6.

The dual purpose press-bar and heat sink 62 is configured to make physical contact with the second side 56 of the high data transfer ICC 14. In a preferred embodiment, the dual purpose press-bar and heat sink 62 is positioned to overlie the ICC contacts 60 and make physical contact with the second side 56 of the high data transfer ICC 14 at a position corresponding to the embedded circuit housed within the high data transfer ICC 14. For example, see the simplified angled view of the ICC reader 12*b* assembled with the high data transfer ICC 14 inserted as illustrated in FIG. 6.

The dual purpose press-bar and heat sink 62 conducts and dissipates internal heat generated by the embedded circuit housed within the high data transfer ICC 14. In a preferred embodiment, the surface area of the dual purpose press-bar and heat sink 62 is large to increase its contact with the high data transfer ICC 14 and a surrounding cooling medium, such as air. The dual purpose press-bar and heat sink 62 will be discussed in further detail with respect to FIG. 6.

The mounting portions 54 are configured to engage a circuit board to mount the encasing member 52 to the circuit board. For example, see the simplified angled view of the ICC reader 12*b* assembled and mounted to a circuit board as illustrated in FIG. 6. The mounting portions 54 will be discussed in further detail with respect to FIG. 6.

FIG. 6 illustrates a simplified angled view of the ICC reader 12*b* according to the second embodiment, assembled and mounted to a circuit board 66, and the high data transfer ICC 14 inserted.

The circuit board 66 includes an integrated circuit (not shown) configured to provide, for example, identification, authentication, data storage, applications, data encryption, and data decryption. The circuit board 66 also includes electrical components (not shown), such as transistors, inductors, resistors, and capacitors, for the tuner(s) 22, the processor 26, and the audio/video processor 28.

The support member 50 is mounted to the circuit board 66. As discussed with respect to FIG. 5, the support member 50 is configured to support the high data transfer ICC 14 when inserted and the secure ICC contacts 60. The support member 50 secures the ICC contacts 60 to the circuit board 66 such that the ICC contacts 60 are electrically connected to contact pads on the circuit board 66 and are electrically connected to the contact pads on the first side 55 of the high data transfer ICC 14 when the high data transfer ICC 14 is inserted.

In contrast to the encasing member 32 of the ICC reader 12*a*, the encasing member 52 is physically coupled to the circuit board 66, rather than the support member 50, by the mounting portions 54. Particularly, the mounting portions 54 are inserted in to slots of the circuit board 66. When the encasing member 52 is physically coupled to the support member 50 and the high data transfer ICC 14 is inserted, the dual purpose press-bar and heat sink 62 physically contacts the second side 56 of the high data transfer ICC 14. It should be noted that, although the encasing member 52 is coupled to the circuit board 66 by the mounting portions 54, any method may be used to physically couple the encasing member 52 to the circuit board 66.

As discussed with respect to FIG. 5, the encasing member 52 and the dual purpose press-bar and heat sink 62 are both made of metal of high thermal conductibility, such as copper. By having both the encasing member 52 and the dual purpose press-bar and heat sink 62 made of metal and directly connected to each other, the encasing member 52, itself, can accept and remove heat in addition to the dual purpose press-bar and heat sink 62. Particularly, the encasing member 52, itself, spreads heat over a larger surface area and increases the contact area with a surrounding cooling medium, such as air. As such, the encasing member 52 assists the dual purpose press-bar and heat sink 62 for rapid transfer of heat from the high data transfer ICC 14. In addition, the opening 64 allows a surround cooling medium to flow between the encasing member 52 and the second side 56 of the high data transfer ICC 14. As such, a surrounding cooling medium may contact both inner and outer surfaces of the encasing member 32, thereby further improving heat dissipation.

Similar to the dual purpose press-bar and heat sink 36 of the first embodiment, the dual purpose press-bar and heat sink 62 provides two functions. First, the dual purpose press-bar and heat sink 62 conducts and dissipates internal heat generated by the high data transfer ICC 14. Particularly, as discussed with respect to FIG. 5, the dual purpose press-bar and heat sink 62 physically contacts the second side 56 of the high data transfer ICC 14 at a position corresponding to the embedded circuit housed within the high data transfer ICC 14, and dissipates heat generated by the embedded circuit. Second, the dual purpose press-bar and heat sink 62 ensures that the contact pads on the first side 55 of the high data transfer ICC 14 create reliable electrical connections with the ICC contacts 60. Particularly, the dual purpose press-bar and heat sink 62 ensures that the high data transfer ICC 14 remains coplanar when inserted in to the ICC reader 12*b* and ensures that the high data transfer ICC 14 remains stationary when inserted. Therefore, in contrast to conventional encasing members that are typically made of plastic and act as insulator, the encasing member 52 includes the dual purpose press-bar and heat sink 62 that simultaneously dissipates heat from the high data transfer ICC 14 and ensures that the high data transfer ICC 14 maintains proper electrical connections with the ICC contacts 60.

FIG. 7 illustrates a simplified cross-sectional view, of the dual purpose press-bar and heat sink 36 of the ICC reader 12*a*, and a high data transfer ICC 14, according to one embodiment, when it is inserted in to the ICC reader 12*a*. The high data transfer ICC 14 includes an embedded circuit 68, contact pads 70, and a heat transfer plate 72.

The embedded circuit 68 is configured to perform processing for the high data transfer ICC 14, such as decrypting or descrambling protected program content as previously discussed.

The contact pads 70 are electrically coupled to the embedded circuit 68. The contact pads 70 provide data input/output to the ICC contacts 34.

The heat transfer plate 72 is physically coupled to the embedded circuit 68. The heat transfer plate 72 improves thermal and heat transfer from the embedded circuit 68 to the dual purpose press-bar and heat sink 36 by providing a metal-to-metal contact for the dual purpose press-bar and heat sink 36. In a preferred embodiment, the heat transfer plate 72 sits physically on top of the embedded circuit 68. For example, the heat transfer plate 72 may be coupled to the embedded circuit 68 by a thermally conductive adhesive. In addition, in a preferred embodiment, the heat transfer plate 72 has a large surface area relative to the contact pads 70 to increase thermal and heat transfer contact with the dual purpose press-bar and heat sink 36. It should be noted that the encasing member 32 and the dual purpose press-bar and heat sink 36 of the ICC reader 12*a* are shown in FIG. 7 for illustrative purposes. The high data transfer ICC 14 may also be used in conjunction with the ICC reader 12*b*.

In this embodiment, the heat sink 36 is coupled to the high data transfer ICC 14 itself rather than to the ICC contacts 34. Namely, in one embodiment, the heat transfer path is the chip 68 to the contacts 34 and then to the heat sink 36, while in another embodiment, it is from the chip 68 to the heat transfer plate 72 then to the heat sink 36, and in another embodiment, it is from chip 68 to the heat sink 36, with additional heat exiting the bottom via heat transfer plate 72, as shown in FIG. 7.

It will be appreciated that, although specific embodiments of the present disclosure are described herein for purposes of illustration, various modifications may be made without departing from the spirit and scope of the present disclosure. Accordingly, the present disclosure is not limited except as by the appended claims.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

The invention claimed is:

1. A card reader device, comprising:
   a support member;
   a plurality of card contacts coupled to and extending from the support member, each of the plurality of card contacts being in electrical contact with a contact pad on a first surface of a card;
   a circuit board in electrical contact with the card contacts, the plurality of card contacts being coupled to the circuit board by the support member; and
   an encasing member including:
   first and second side portions, the support member being positioned between the first and second side portions;
   mounting members extending from the first and second side portions and towards the circuit board, the mounting members mounting the encasing member to the circuit board;
   an elevated portion directly attached to the first and second side portions, the elevated portion substantially covering the support member and the plurality of card contacts, the elevated portion being spaced from a second surface, opposite to the first surface, of the card;
   first and second engaging portions directly attached to the first and second side portions, respectively, the first and second engaging portions affixing the encasing member to the support member, the support member being sandwiched between the elevated portion and the first and second engaging portions;
   a heat sink overlaying the plurality of card contacts, the heat sink projecting from the elevated portion towards the support member and the plurality of card contacts, the heat sink being in physical contact with the second surface of the card;
   first and second openings in the elevated portion, the first opening being positioned lateral to a first side of the heat sink, the second opening being positioned lateral to a second side, opposite to the first side, of the heat sink; and
   first and second plurality of air flow apertures in the elevated portion, the first plurality of air flow apertures being positioned lateral to a third side of the heat sink, the second plurality of air flow apertures being positioned lateral to a fourth side, opposite to the third side, of the heat sink, the first side portion being spaced from the third side of the heat sink by the first plurality of air flow apertures, the second side portion being spaced from the fourth side of the heat sink by the second plurality of air flow apertures, the first and second openings and the first and second plurality of air flow apertures exposing the second surface of the card to provide an air flow channel that flows between the first and second plurality of air flow apertures, adjacent to the heat sink, and on the second surface of the card.

2. The card reader device of claim 1, wherein the encasing member and the heat sink are metal, and the support member is plastic.

3. The card reader device of claim 1, wherein the encasing member includes retention clips in physical contact with the second surface of the card and exert a force on the second surface of the card.

4. The card reader device of claim 1, wherein the encasing member includes a first rib and a second rib, the first rib and the second rib projecting from the elevated portion towards the support member, the first rib and the second rib being in physical contact with the second surface of the card, the heat sink being positioned between the first rib and the second rib.

5. The card reader device of claim 1, wherein the heat sink includes a first face and a second face opposite of the first face, the second face being in physical contact with the second surface of the card.

6. The card reader device of claim 5, wherein the heat sink further includes four sides, the four sides each being physically coupled to the encasing member.

7. The card reader device of claim 1, wherein the support member includes holding portions configured to guide the card.

8. A card reader device, comprising:
   a support member;
   a plurality of card contacts, each of the plurality of card contacts configured to make electrical connections with a circuit board and a contact pad on a first surface of a card, the plurality of card contacts being held secure to the circuit board by the support member; and
   an encasing member including:
   first and second side portions, the support member being positioned between the first and second side portions;
   mounting members extending from the first and second side portions to the circuit board, the mounting members configured to mount the encasing member to the circuit board;
   an elevated portion directly attached to the first and second side portions, the elevated portion substantially covering the support member and the plurality of card contacts, the elevated portion configured to be spaced from a second surface, opposite to the first surface, of the card;
   first and second engaging portions directly attached to the first and second side portions, respectively, the first and second engaging portions affixing the encasing member to the support member, the first and second engaging portions being spaced from the elevated portion by the support member;

a heat sink overlaying the plurality of card contacts, the heat sink projecting from the elevated portion towards the support member and the plurality of card contacts, the heat sink including a face and four sides, the face configured to make physical contact with a second surface of the card, the four sides each being physically coupled to the elevated portion;

first and second openings in the elevated portion, the first opening being positioned lateral to a first side of the four sides, the second opening being positioned lateral to a second side, opposite to the first side, of the four sides; and first and second plurality of air flow apertures in the elevated portion, the first plurality of air flow apertures being positioned lateral to a third side of the four sides, the second plurality of air flow apertures being positioned lateral to a fourth side, opposite to the third side, of the four sides, the first side portion being spaced from the third side of the heat sink by the first plurality of air flow apertures, the second side portion being spaced from the fourth side of the heat sink by the second plurality of air flow apertures, the first and second openings and the first and second plurality of air flow apertures exposing the second surface of the card to provide an air flow channel that flows between the first and second plurality of air flow apertures, adjacent to the heat sink, and on the second surface of the card.

9. The card reader device of claim 8, wherein the encasing member and the heat sink are metal, and the support member is plastic.

10. The card reader device of claim 8, wherein the encasing member includes retention clips configured to make physical contact with the second surface of the card and exert a force on the second surface of the card.

11. The card reader device of claim 8, wherein the encasing member includes a first rib and a second rib, the first rib and the second rib projecting from the elevated portion towards the support member, the first rib and the second rib configured to make physical contact with the second surface of the card, the heat sink being positioned between the first rib and the second rib.

12. A card reader device, comprising:
a support member;
a plurality of card contacts, each of the plurality of card contacts configured to make electrical connections with a circuit board and a contact pad on a first surface of a card, the plurality of card contacts being held secure to the circuit board by the support member; and
an encasing member overlying the support member and the plurality of card contacts, the encasing member including:
an aperture overlying the plurality of card contacts, the aperture exposing the support member; and
a heat sink positioned in the aperture, the heat sink including:
a first portion directly attached to the encasing member, the first portion extending from the aperture towards the support member; and
a second portion including a face, a first side, a second side, a third side, and a fourth side, the face configured to make physical contact with a second surface of the card, the first side being directly attached to the first portion, the second, third, and fourth sides being detached and separated from the encasing member to provide an air flow channel that flows through the aperture and between the encasing member and the support member.

13. The card reader device of claim 12, wherein the encasing member includes mounting members that mount the encasing member to the circuit board, the mounting members configured to insert in to slots in the circuit board.

14. The card reader device of claim 12, wherein the first portion of the heat sink extends in a first direction that is substantially perpendicular to a surface of the support member, and the second portion of the heat sink extends in a second direction that is substantially parallel to the surface of the support member.

15. The card reader device of claim 13, wherein the support member includes a lower portion, sidewalls, and an upper portion, the lower portion, the sidewalls, and the upper portion forming a slot to receive the card, the entire support member being separated and spaced from the entire encasing member.

16. The card reader device of claim 1, wherein the mounting members insert in to slots in the circuit board.

17. The card reader device of claim 1, wherein the elevated portion and the first and second engaging portions extend in a first direction, and the first and second side portions extend in a second direction that is substantially perpendicular to the first direction.

* * * * *